US011980027B2

(12) United States Patent
Lee

(10) Patent No.: US 11,980,027 B2
(45) Date of Patent: May 7, 2024

(54) SEMICONDUCTOR MEMORY DEVICE AND METHOD OF MANUFACTURING THE SAME

(71) Applicant: SK hynix Inc., Icheon (KR)

(72) Inventor: Sang Bum Lee, Incheon (KR)

(73) Assignee: SK hynix Inc., Icheon (KR)

(*) Notice: Subject to any disclaimer, the term of this patent is extended or adjusted under 35 U.S.C. 154(b) by 15 days.

(21) Appl. No.: 17/881,070

(22) Filed: Aug. 4, 2022

(65) Prior Publication Data

US 2022/0375955 A1 Nov. 24, 2022

Related U.S. Application Data

(63) Continuation of application No. 16/898,276, filed on Jun. 10, 2020, now Pat. No. 11,444,092.

(30) Foreign Application Priority Data

Oct. 11, 2019 (KR) .......................... 10-2019-0126177

(51) Int. Cl.
*H10B 41/20* (2023.01)
*H10B 41/10* (2023.01)
(Continued)

(52) U.S. Cl.
CPC ............. *H10B 41/20* (2023.02); *H10B 41/10* (2023.02); *H10B 43/10* (2023.02); *H10B 43/20* (2023.02)

(58) Field of Classification Search
CPC ......... H01L 27/11551; H01L 27/11519; H01L 27/11565; H01L 27/11578;
(Continued)

(56) References Cited

U.S. PATENT DOCUMENTS 9,324,732 B2 * 4/2016 Oh .......................... H01L 29/792
9,653,474 B2 * 5/2017 Yune .................. H01L 27/11568
(Continued)

FOREIGN PATENT DOCUMENTS

CN 103681684 A 3/2014
CN 106558590 A 4/2017
(Continued)

OTHER PUBLICATIONS

Notification of the First Office Action from The Patent Office of The People's Republic of China dated May 4, 2023 regarding application No. 2023050401907350.

*Primary Examiner* — Shahed Ahmed
*Assistant Examiner* — Khatib A Rahman

(57) ABSTRACT

The present technology includes a semiconductor memory device and a method of manufacturing the same. The semiconductor memory device includes a first semiconductor layer, a cell stack and a peripheral stack each disposed on the first semiconductor layer, a first slit structure extending in a first direction and penetrating the cell stack and the peripheral stack, a penetration structure penetrating the peripheral stack and being spaced apart from the first slit structure, and a support structure penetrating the peripheral stack. The support structure includes first sidewall portions spaced apart from each other and a second sidewall portion connecting the first sidewall portions to each other, and the penetration structure is disposed between the first sidewall portions.

10 Claims, 24 Drawing Sheets

(51) Int. Cl.
*H10B 43/10* (2023.01)
*H10B 43/20* (2023.01)

(58) Field of Classification Search
CPC ......... H01L 27/11556; H01L 27/11582; H01L 27/11568; H01L 27/115; H01L 27/0688; H10B 41/20; H10B 41/10; H10B 43/10; H10B 43/20; H10B 41/27; H10B 43/27; H10B 43/30; H10B 69/00
See application file for complete search history.

(56) References Cited

U.S. PATENT DOCUMENTS

| | | | |
|---|---|---|---|
| 10,930,663 B2 * | 2/2021 | Lu | H01L 21/76895 |
| 11,334,250 B2 * | 5/2022 | Kim | G11C 16/26 |
| 11,335,698 B2 * | 5/2022 | Shimura | H01L 27/11582 |
| 2009/0072274 A1 | 3/2009 | Knoefler et al. | |
| 2012/0280303 A1 | 11/2012 | Kiyotoshi et al. | |
| 2013/0032873 A1 | 2/2013 | Kiyotoshi | |
| 2013/0154055 A1 * | 6/2013 | Park | H01L 28/91 257/532 |
| 2016/0126251 A1 | 5/2016 | Fujita et al. | |
| 2016/0126252 A1 | 5/2016 | Tsuda et al. | |
| 2016/0225785 A1 | 8/2016 | Kim et al. | |
| 2016/0322381 A1 | 11/2016 | Liu et al. | |
| 2017/0084624 A1 | 3/2017 | Lee et al. | |
| 2017/0338241 A1 | 11/2017 | Lee | |
| 2018/0090512 A1 | 3/2018 | Kim et al. | |
| 2019/0067314 A1 | 2/2019 | Lu et al. | |

FOREIGN PATENT DOCUMENTS

| | | |
|---|---|---|
| CN | 106952926 A | 7/2017 |
| CN | 107068687 A | 8/2017 |
| CN | 107425005 A | 12/2017 |
| CN | 107810552 A | 3/2018 |
| CN | 108431955 A | 8/2018 |
| CN | 109103193 A | 12/2018 |
| CN | 109427805 A | 3/2019 |
| CN | 110114881 A | 8/2019 |
| JP | 2011-165972 A | 8/2011 |
| KR | 20120092483 A | 8/2012 |
| KR | 20170115753 A | 10/2017 |
| WO | WO2016167984 A1 | 10/2016 |

* cited by examiner

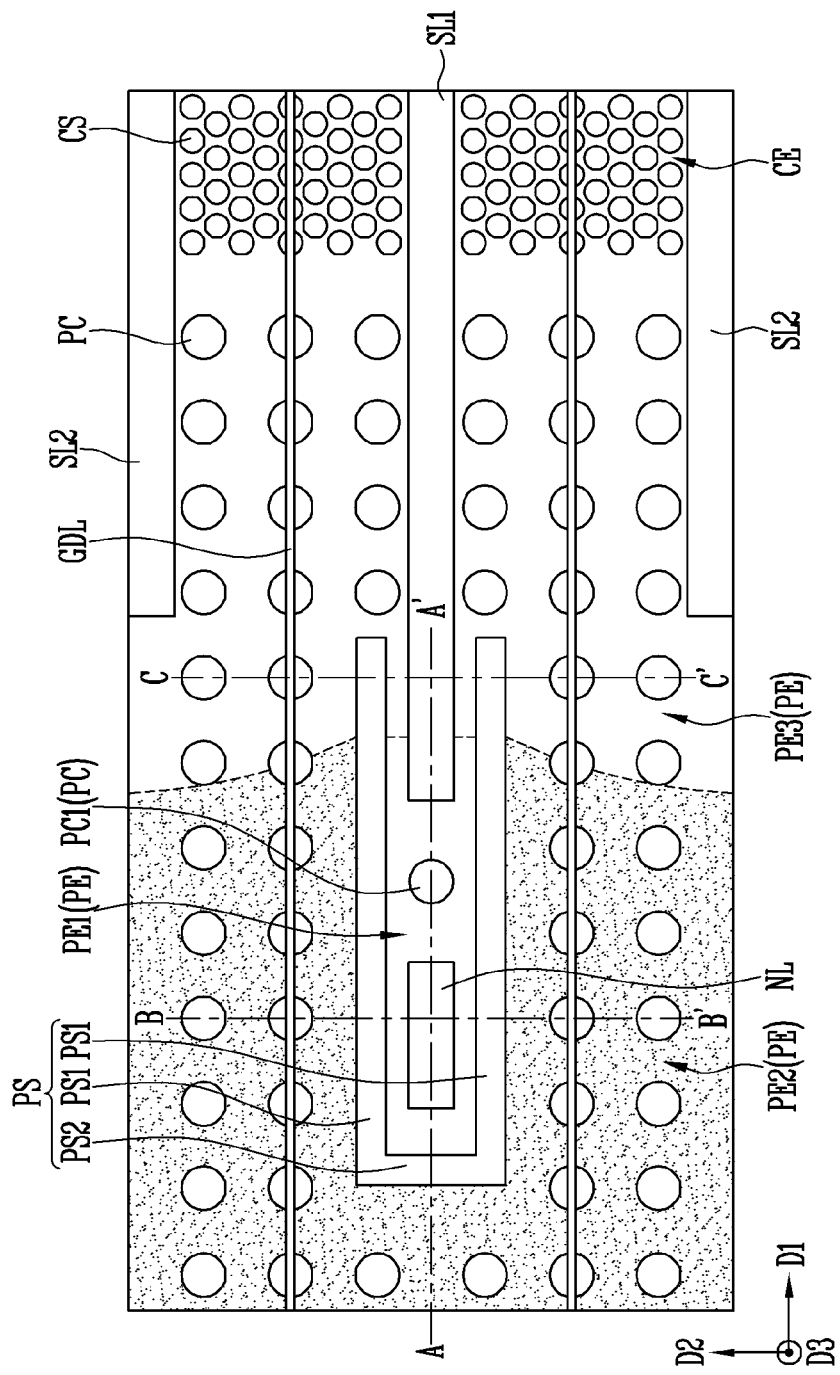

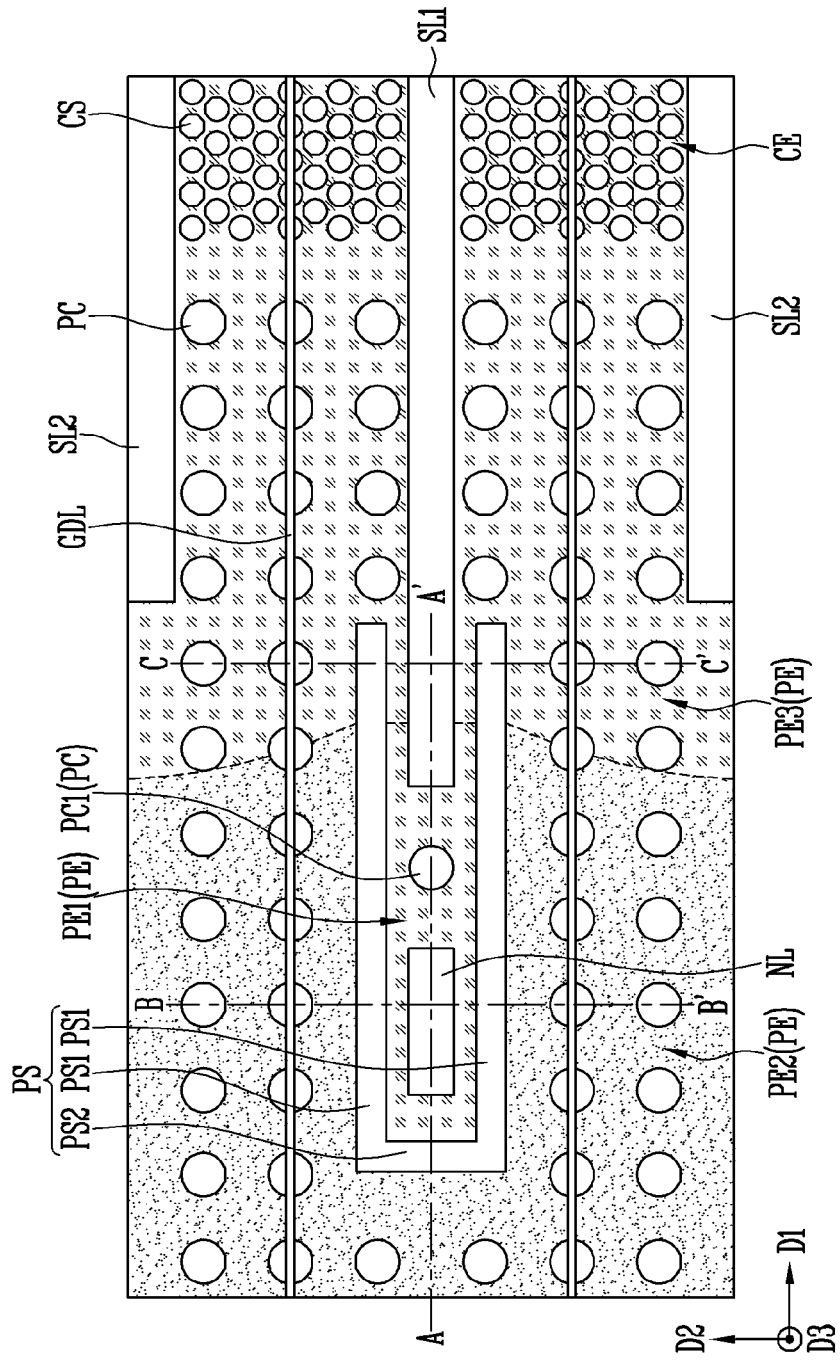

SEMICONDUCTOR MEMORY DEVICE AND METHOD OF MANUFACTURING THE SAME

CROSS-REFERENCE TO RELATED APPLICATION

The present application is the continuation of U.S. patent application Ser. No. 16/898,276 filed Jun. 10, 2020, and claims priority under 35 U.S.C. § 119(a) to Korean patent application number 10-2019-0126177, filed on Oct. 11, 2019, in the Korean Intellectual Property Office, the entire disclosure of which is incorporated herein by reference.

BACKGROUND

1. Field of Invention

The present disclosure relates to a semiconductor memory device and a method of manufacturing the same, and more particularly, to a three-dimensional semiconductor memory device and a method of manufacturing the same.

2. Description of Related Art

A semiconductor memory device includes memory cells capable of storing data.

According to a method of storing and maintaining data, the semiconductor memory device may be classified into a volatile semiconductor memory device and a non-volatile semiconductor memory device. The volatile semiconductor memory device is a memory device in which stored data is lost when supply of power is cut off, and the non-volatile semiconductor memory device is a memory device in which stored data is maintained even though supply of power is cut off.

Recently, as the use of a portable electronic device increases, the use of the non-volatile semiconductor memory device increases, and high integration and large capacity of the semiconductor memory device are required for portability and large capacity. For such high integration and large capacity, a three-dimensional semiconductor memory device has been proposed.

SUMMARY

Embodiments of the present disclosure provide a semiconductor memory device and a method of manufacturing the same capable of improving operation reliability.

A semiconductor memory device according to an embodiment of the present disclosure may include a first semiconductor layer, a cell stack and a peripheral stack each disposed on the first semiconductor layer, a first slit structure extending in a first direction and penetrating the cell stack and the peripheral stack, a penetration structure penetrating the peripheral stack and being spaced apart from the first slit structure, and a support structure penetrating the peripheral stack. The support structure may include first sidewall portions spaced apart from each other and a second sidewall portion connecting the first sidewall portions to each other, and the penetration structure may be disposed between the first sidewall portions.

A semiconductor memory device according to an embodiment of the present disclosure may include a first semiconductor layer, a cell stack and a peripheral stack each disposed on the first semiconductor layer, and a support structure penetrating the peripheral stack. The peripheral stack may include a first portion surrounded by the support structure and a second portion spaced apart from the first portion by the support structure, the first portion may include first insulating patterns arranged in a vertical direction and an insulating film filling one or more spaces, each of the spaces being between an adjacent pair of the first insulating patterns, and the second portion may include alternately stacked second insulating patterns and sacrificial patterns.

A semiconductor memory device according to an embodiment of the present disclosure may include a first semiconductor layer, a cell stack and a peripheral stack each disposed on the first semiconductor layer, a penetration structure penetrating the peripheral stack, and a support structure penetrating the peripheral stack. The peripheral stack may include a first portion in the support structure and a second portion connecting the first portion and the cell stack, and the penetration structure may penetrate the first portion.

A method of manufacturing a semiconductor memory device according to an embodiment of the present disclosure may include forming a cell stack and a peripheral stack, forming a support structure penetrating the peripheral stack, forming a penetration slit penetrating the first portion, removing the first sacrificial patterns of the first portion through the penetration slit, filling first spaces with first conductive patterns, and removing the first conductive patterns of the first portion through the penetration slit. The peripheral stack includes a first portion disposed in the support structure. The first portion includes first sacrificial patterns and first insulating patterns. Each of the first spaces are between an adjacent pair of the first insulating patterns of the first portion.

A method of manufacturing a semiconductor memory device according to an embodiment of the present disclosure may include forming a cell stack and a peripheral stack including insulating patterns and sacrificial patterns, forming a support structure penetrating the peripheral stack, forming a first slit penetrating the cell stack and the peripheral stack, forming a penetration slit penetrating the peripheral stack, removing the sacrificial patterns of the peripheral stack through the first slit and the penetration slit, filling spaces with conductive patterns, and removing the conductive patterns exposed by the penetration slit. A portion of the first slit may be disposed in the support structure. The penetration slit may be disposed in the support structure. Each of the spaces are between an adjacent pair of the insulating patterns of the peripheral stack.

In the semiconductor memory device according to embodiments of the present disclosure, a portion of the peripheral stack surrounded by the support structure may not include conductive patterns. Therefore, operation reliability of the semiconductor memory device according to embodiments of the present disclosure may be improved.

BRIEF DESCRIPTION OF THE DRAWINGS

FIGS. 2A, 3A, 4A, 5A, and 6A are plan views for describing a method of manufacturing the semiconductor memory device according to an embodiment of the present disclosure.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Figure 1A:
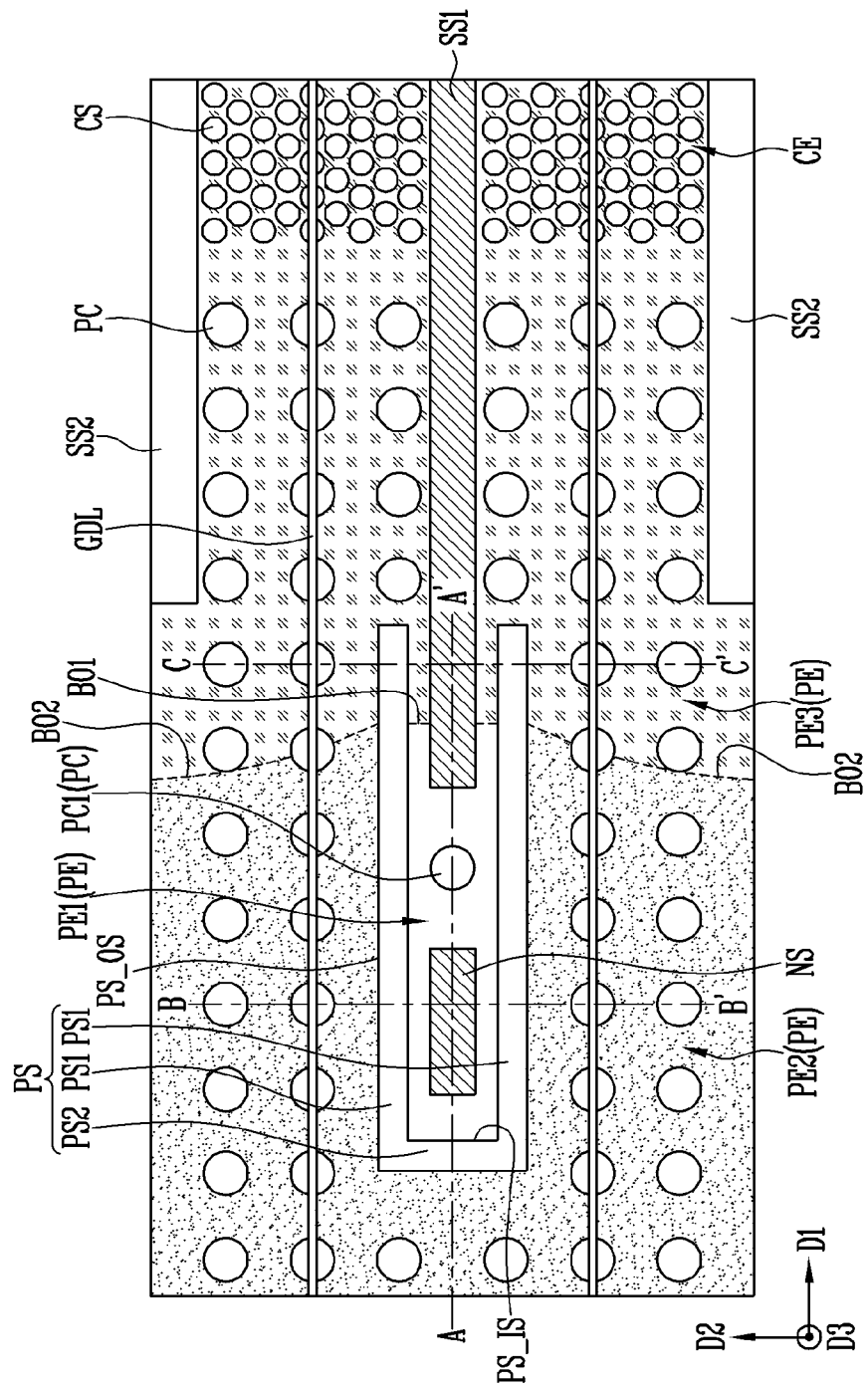
FIG. 1A is a plan view of a semiconductor memory device according to an embodiment of the present disclosure.
Figure 1B:
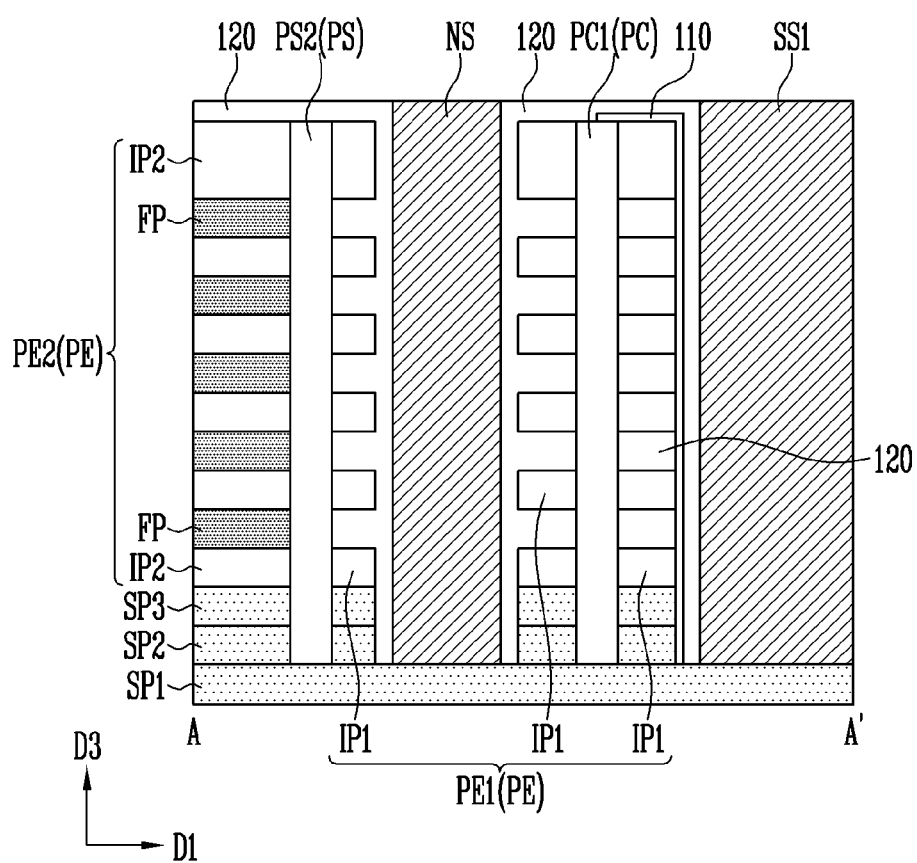
FIG. 1B is a cross-sectional view taken along a line A-A' of FIG. 1A.
Figure 1C:
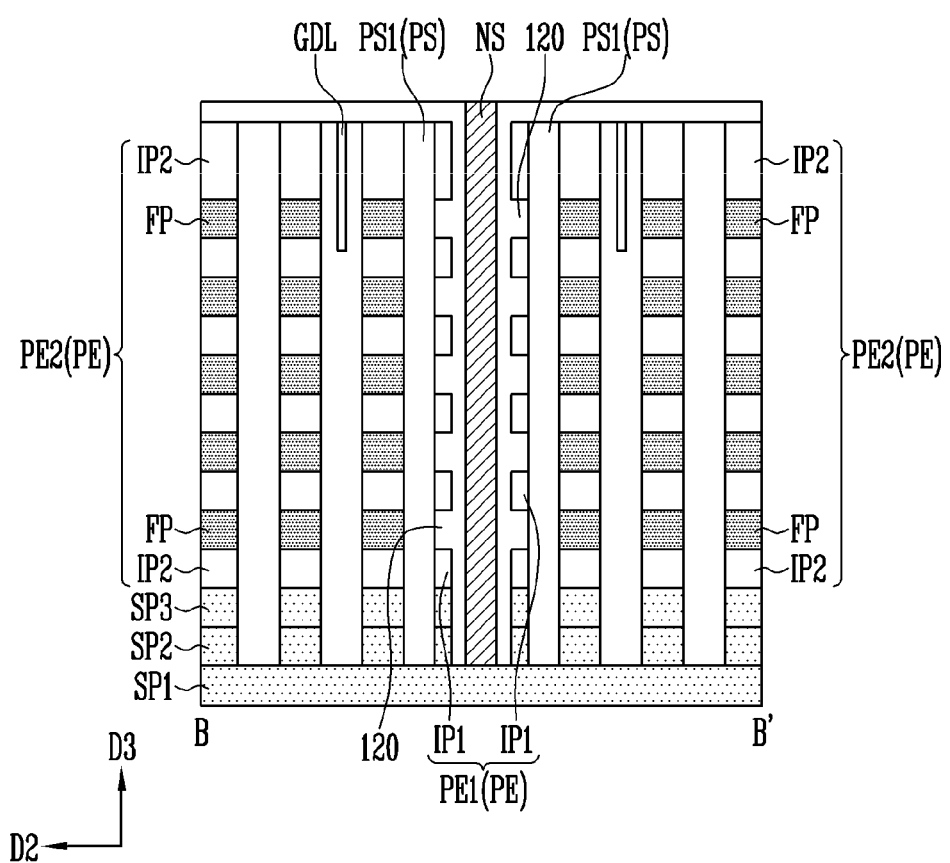
FIG. 1C is a cross-sectional view taken along a line B-B' of FIG. 1A.
Figure 1D:
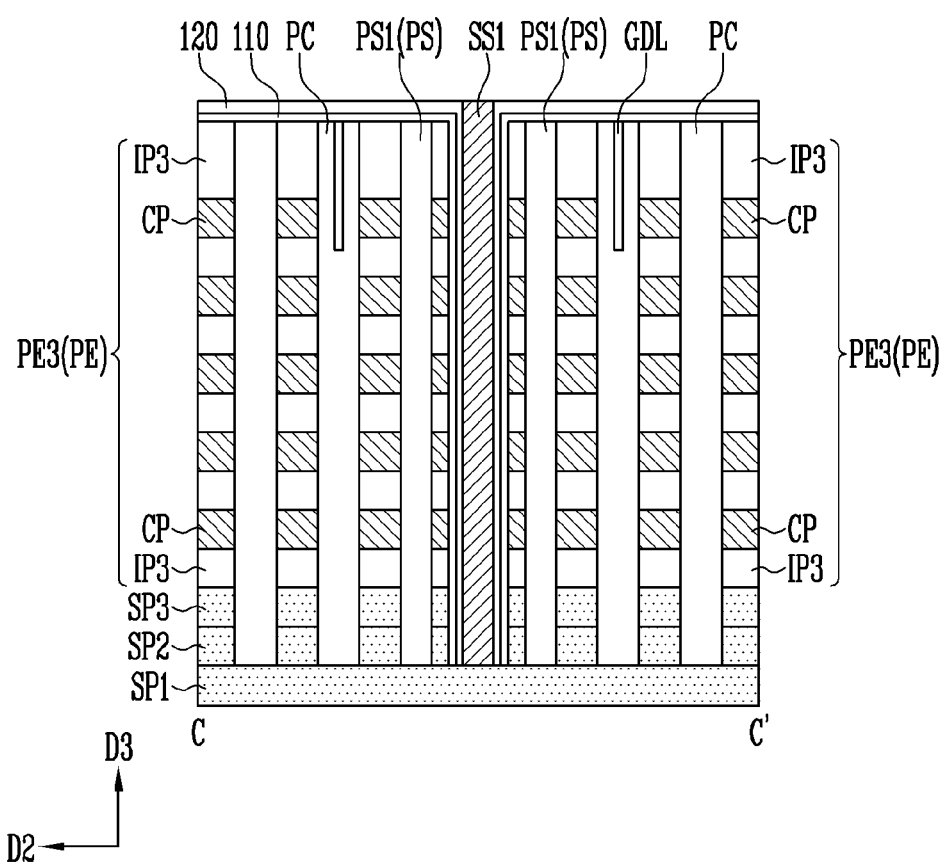
FIG. 1D is a cross-sectional view taken along a line C-C' of FIG. 1A.

FIG. 1A is a plan view of a semiconductor memory device according to an embodiment of the present disclosure. FIG. 1B is a cross-sectional view taken along a line A-A' of FIG. 1A. FIG. 1C is a cross-sectional view taken along a line B-B' of FIG. 1A. FIG. 1D is a cross-sectional view taken along a line C-C' of FIG. 1A.

Referring to FIGS. 1A to 1D, the semiconductor memory device according to the present embodiment may include a first semiconductor layer SP1. The first semiconductor layer SP1 may have a shape of a plate extending along a plane defined by a first direction D1 and a second direction D2. For example, the first semiconductor layer SP1 may include polysilicon.

Although not shown, a substrate including a peripheral circuit structure and a connection structure may be provided under the first semiconductor layer SP1. The substrate may be a single crystal semiconductor substrate. For example, the substrate may be a bulk silicon substrate, a silicon on insulator substrate, a germanium substrate, a germanium on insulator substrate, a silicon-germanium substrate, or an epitaxial thin film formed through a selective epitaxial growth method.

The peripheral circuit structure may include NMOS transistors, PMOS transistors, a resistor, and a capacitor. The NMOS transistors, the PMOS transistors, the resistor, and the capacitor may be used as elements configuring a row decoder, a column decoder, a page buffer circuit, and an input/output circuit. The connection structure may include a contact plug and a wire.

A second semiconductor layer SP2 may be provided on the first semiconductor layer SP1. A third semiconductor layer SP3 may be provided on the second semiconductor layer SP2. The second and third semiconductor layers SP2 and SP3 may have a shape of a plate extending along a plane defined by the first direction D1 and the second direction D2. For example, the second and third semiconductor layers SP2 and SP3 may include polysilicon. An impurity may be doped in one or more of the first, second, and third semiconductor layers SP1, SP2, and SP3.

A peripheral stack PE may be provided on the third semiconductor layer SP3. The peripheral stack PE may include a plurality of layers stacked in a vertical direction (that is, a third direction D3). A cell stack CE may be provided on the third semiconductor layer SP3. The cell stack CE may include a plurality of layers stacked in the vertical direction. The peripheral stack PE and the cell stack CE may be connected to each other. The peripheral stack PE and the cell stack CE will be described later in more detail.

A first slit structure SS1 penetrating the cell stack CE and the peripheral stack PE may be provided. The first slit structure SS1 may further penetrate the second and third semiconductor layers SP2 and SP3. The first slit structure SS1 may extend in the first direction D1. The first slit structure SS1 may include a conductive material. For example, the first slit structure SS1 may include polysilicon, or tungsten, or both. For example, when the first slit structure SS1 includes polysilicon and tungsten, a lower portion of the first slit structure SS1 may include polysilicon, and an upper portion of the first slit structure SS1 may include tungsten.

Second slit structures SS2 penetrating the cell stack CE and the peripheral stack PE may be provided. The second slit structures SS2 may further penetrate the second and third semiconductor layers SP2 and SP3. The second slit structures SS2 may extend in the first direction D1. An adjacent pair of the second slit structures SS2 may be spaced apart from each other in the second direction D2 with the first slit structure SS1 interposed therebetween. For example, a first one of the pair of the second slit structures SS2 may be spaced apart from the first slit structure SS1 in the second direction D2 by a first distance, and a second one of the pair of the second slit structures SS2 may be spaced apart from the first slit structure SS1 in the second direction D2 by a second distance, the first distance being substantially equal to the second distance. The first slit structure SS1 and each of the second slit structures SS2 may be spaced apart from each other in the second direction D2. The second slit structures SS2 may include an insulating material. For example, the second slit structures SS2 may include silicon oxide.

Channel structures CS penetrating the cell stack CE may be provided. The channel structures CS may be provided between the first and second slit structures SS1 and SS2. The channel structures CS may be symmetrically disposed with respect to the first slit structure SS1. For example, a first group of the channel structure CS between the first slit structure SS1 and a first one of the second slit structure SS2 and a second group of the channel structure CS between the first slit structure SS1 and a second one of the second slit structure SS2 are disposed symmetrically disposed with respect to the first slit structure SS1. Each of the channel structures CS may include a channel film penetrating the cell stack CE and a memory film surrounding the channel film. For example, the channel film may include polysilicon. An impurity may be doped in the channel film. The memory film may include a tunnel film surrounding the channel film, a storage film surrounding the tunnel film, and a blocking film surrounding the storage film. The tunnel film may include an insulating material capable of charge tunneling. The storage film may include a material to which charge may be trapped. For example, the storage film may include one or more of nitride, silicon, a phase change material, and nanodot. The blocking film may include an insulating material capable of blocking transfer of charge.

Support pillars PC penetrating the peripheral stack PE may be provided. The support pillars PC may further penetrate the second and third semiconductor layers SP2 and SP3. The support pillars PC may be spaced apart from each other. Some of the support pillars PC may be disposed between the first and second slit structures SS1 and SS2. The support pillars PC disposed between the first and second slit structures SS1 and SS2 may be symmetrically disposed with respect to the first slit structure SS1. For example, a first group of the support pillars PC between the first slit structure SS1 and a first one of the second slit structure SS2 and a second group of the support pillars PC between the first slit structure SS1 and a second one of the second slit structure SS2 are disposed symmetrically disposed with respect to the first slit structure SS1. The support pillars PC may support a plurality of layers of the peripheral stack PE. For example, the support pillars PC may include silicon oxide.

A support structure PS penetrating the peripheral stack PE may be provided. The support structure PS may penetrate the second and third semiconductor layers SP2 and SP3. The support structure PS may be surrounded by the support pillars PC. For example, the support structure PS may include silicon oxide.

The support structure PS may include first sidewall portions PS1 each extending in the first direction D1 and one or more second sidewall portions PS2 each extending in the second direction D2. For example, the support structure PS may include a pair of first sidewall portions PS1 and a single second sidewall portion PS2. The first sidewall portions PS1 may be spaced apart from each other in the second direction D2. The second sidewall portion PS2 may connect the first sidewall portions PS1 to each other. The second sidewall portion PS2 may be connected to an end portion of each of the first sidewall portions PS1. A portion of the first slit structure SS1 may be disposed between the first sidewall portions PS1. In other words, the portion of the first slit structure SS1 may be disposed in the support structure PS.

The first sidewall portions PS1 may be spaced apart from the second slit structures SS2 in the first direction D1. The first sidewall portions PS1 may be spaced apart from the second slit structures SS2 in the second direction D2. The first sidewall portions PS1 may be spaced apart from the first slit structure SS1 in the second direction D2. The second sidewall portion PS2 may be spaced apart from the first slit structure SS1 in the first direction D1. The shortest distance between the support structure PS and the first slit structure SS1 may be less than the shortest distance between the support structure PS and the second slit structure SS2.

The peripheral stack PE may include a first portion PE1, a second portion PE2, and a third portion PE3. The first portion PE1, the second portion PE2, and the third portion PE3 may be distinguished from each other in a plan view according to FIG. 1A. The third portion PE3 may be connected to the cell stack CE, and the first and second portions PE1 and PE2 may be spaced apart from the cell stack CE.

The first portion PE1 may be surrounded by the support structure PS. In other words, the first portion PE1 may be disposed in the support structure PS. The first portion PE1 may be disposed between the first sidewall portions PS1 of the support structure PS. The first portion PE1 may be in contact with an inner sidewall PS_IS of the support structure PS. A portion of the first slit structure SS1 may penetrate the first portion PE1.

The second portion PE2 may be spaced apart from the first portion PE1 with the support structure PS therebetween. The second portion PE2 may be in contact with an outer sidewall PS_OS of the support structure PS. The support structure PS may penetrate between the first and second portions PE1 and PE2. The first slit structure SS1 may not penetrate the second portion PE2.

The third portion PE3 may connect the first and second portions PE1 and PE2 to each other. A portion of the third portion PE3 may be disposed between the first sidewall portions PS1 of the support structure PS. The third portion PE3 may be in contact with the inner sidewall PS_IS and the outer sidewall PS_OS of the support structure PS. The first slit structure SS1 may penetrate the third portion PE3. The second slit structures SS2 may penetrate the third portion PE3. The second slit structures SS2 may not penetrate the first and second portions PE1 and PE2. In other words, an end portion of each of the second slit structures SS2 may be disposed in the third portion PE3.

A first boundary BO1 between the first portion PE1 and the third portion PE3 may be connected to the inner sidewall PS_IS of the support structure PS. The boundary BO1 between the first portion PE1 and the third portion PE3 may be further connected to the first slit structure SS1. A boundary BO2 between the second portion PE2 and the third portion PE3 may be connected to the outer sidewall PS_OS of the support structure PS.

The first portion PE1 may include first insulating patterns IP1, the second portion PE2 may include second insulating patterns IP2, the third portion PE3 may include third insulating patterns IP3, and the cell stack CE may include fourth insulating patterns (not shown). The first to third insulating patterns IP1, IP2, and IP3 and the fourth insulating pattern disposed on the same level (that is, a layer of the same height) may be integrally formed to form one insulating pattern. That is, each of portions of one insulation pattern may be the first to third insulation patterns IP1, IP2, and IP3 and the fourth insulation pattern. However, for convenience of description, the first to third insulating patterns IP1, IP2, and IP3 and the fourth insulating pattern will be separately described. For example, the first to third insulating patterns IP1, IP2, and IP3 and the fourth insulating patterns may include silicon oxide.

The first insulating patterns IP1 of the first portion PE1 may be arranged in a specific direction (e.g., the vertical direction with respect to the orientation of FIG. 1B). The first insulating patterns IP1 may be spaced apart from each other in the third direction D3.

The second portion PE2 may further include sacrificial patterns FP. The second insulating patterns IP2 and the sacrificial patterns FP of the second portion PE2 may be alternately stacked. For example, the sacrificial patterns FP may include silicon nitride.

The third portion PE3 may further include conductive patterns CP. The third insulating patterns IP3 and the conductive patterns CP of the third portion PE3 may be alternately stacked. The conductive patterns CP may include a gate conductive film. For example, the gate conductive film may include one or more of a doped silicon film, a metal silicide film, tungsten, nickel, and cobalt, and may be used as a word line connected to a memory cell or a select line connected to a select transistor. The conductive patterns CP may further include a gate barrier film surrounding the gate conductive film. For example, the gate barrier film may include titanium nitride, or tantalum nitride, or both.

The cell stack CE may further include conductive patterns (not shown). The fourth insulating patterns and the conductive patterns of the cell stack CE may be alternately stacked. The conductive pattern of the cell stack CE may be integrally formed with the conductive pattern CP of the third portion PE3 of the peripheral stack PE to form one conductive pattern.

A penetration structure NS penetrating the first portion PE1 of the peripheral stack PE may be provided. The penetration structure NS may penetrate the second and third semiconductor layers SP2 and SP3. The penetration structure NS may be spaced apart from the first slit structure SS1 in the first direction D1. The penetration structure NS may be disposed between the first slit structure SS1 and the second sidewall portion PS2 of the support structure PS. The penetration structure NS may be disposed between the first sidewall portions PS1 of the support structure PS. The penetration structure NS may be spaced apart from the first sidewall portions PS1 of the support structure PS in the second direction D2. The penetration structure NS may be surrounded by the support structure PS. Three of four sidewalls of the penetration structure NS may face the inner sidewall PS_IS of the support structure PS.

The penetration structure NS may be spaced apart from the second sidewall portion PS2 of the support structure PS. A distance from which the penetration structure NS is spaced apart from the second sidewall portion PS2 of the support structure PS may be less than a distance from which the first slit structure SS1 is spaced apart from the second sidewall portion PS2 of the support structure PS. The penetration structure NS may include a conductive material. For example, the penetration structure NS may include polysilicon, or tungsten, or both. For example, a lower portion of the penetration structure NS may include polysilicon, and an upper portion of the penetration structure NS may include tungsten.

A support pillar PC may be disposed between the penetration structure NS and the first slit structure SS1. The support pillar PC disposed between the penetration structure NS and the first slit structure SS1 may be defined as a first support pillar PC1. The first support pillar PC1 may be disposed between the first sidewall portions PS1 of the support structure PS. The first support pillar PC1 may penetrate the first portion PE1 of the peripheral stack PE.

Gate separation films GDL extending in the first direction D1 may be provided. The gate separation film GDL may penetrate the cell stack CE and the peripheral stack PE. The gate separation films GDL may cause portions of the conductive patterns of the cell stack CE to be spaced apart from each other. The gate separation film GDL may penetrate an upper portion of the channel structure CS. The gate separation film GDL may further penetrate an upper portion of the support pillar PC. For example, the gate separation films GDL may include silicon oxide.

First and second insulating films 110 and 120 covering the peripheral stack PE may be provided. The first insulating film 110 may be filled between the first slit structure SS1 and the first portion PE1 of the peripheral stack PE, and between the first slit structure SS1 and the third portion PE3 of the peripheral stack PE. The first insulating film 110 may cover a portion of an upper surface of the first portion PE1 of the peripheral stack PE, a portion of an upper surface of the second portion PE2, and substantially all of an upper surface of the third portion PE3.

The second insulating film 120 may be filled between the first insulating patterns IP1 of the first portion PE1 of the peripheral stack PE. For example, the second insulating film 120 may fill one or more spaces, each of the spaces being between an adjacent pair of the first insulating patterns IP1 of the first portion PE1 of the peripheral stack PE. The second insulating film 120 may be filled between the penetration structure NS and the first portion PE1 of the peripheral stack PE, between the first slit structure SS1 and the first portion PE1 of the peripheral stack PE, and between the first slit structure SS1 and the third portion PE3 of the peripheral stack PE. The second insulating film 120 may cover the peripheral stack PE and the first insulating film 110. An average thickness of the first insulating film 110 may be thinner than an average thickness of the second insulating film 120. For example, the first and second insulating films 110 and 120 may include silicon oxide.

The semiconductor memory device according to the embodiment shown in FIGS. 1A to 1D includes the support structure PS and the penetration structure NS surrounded by the support structure PS. Therefore, the first portion PE1 of the peripheral stack PE surrounded by the support structure PS may not include conductive patterns. Thus, operation reliability of the semiconductor memory device may be improved.

FIGS. 2A, 3A, 4A, 5A, and 6A are plan views for describing a method of manufacturing the semiconductor memory device according to an embodiment of the present disclosure. FIGS. 2B, 3B, 4B, 5B, and 6B are cross-sectional views taken along a line A-A' of FIGS. 2A, 3A, 4A, 5A, and 6A, respectively. FIGS. 2C, 3C, 4C, 5C, and 6C are cross-sectional views taken along a line B-B' of FIGS. 2A, 3A, 4A, 5A, and 6A, respectively. FIGS. 3D, 4D, 5D, and 6D are cross-sectional views taken along a line C-C' of FIGS. 3A, 4A, 5A, and 6A, respectively.

For brevity of description, the same reference numerals are used for the components described with reference to FIGS. 1A to 1D, and repetitive description will be omitted.

Figure 2A:
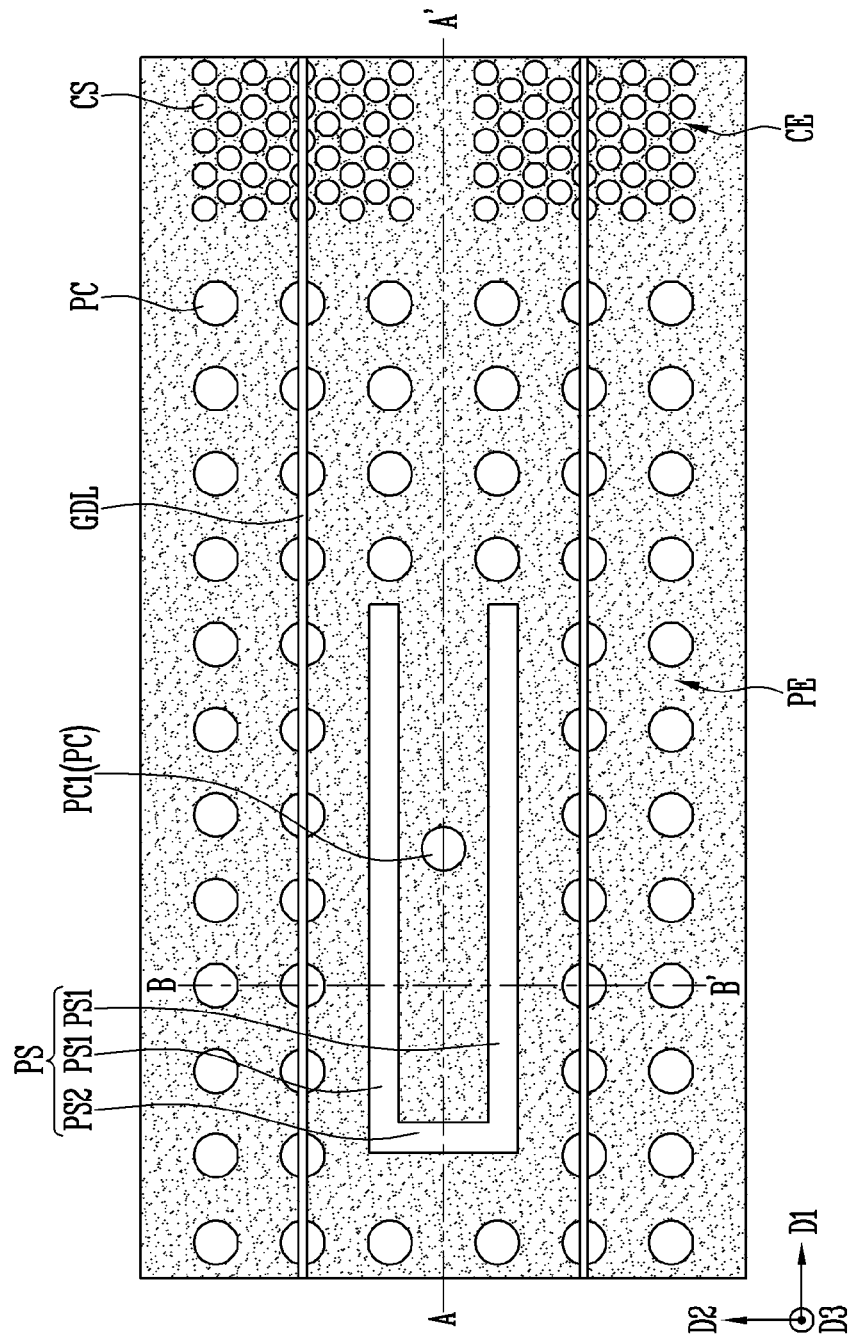
Figure 2B:
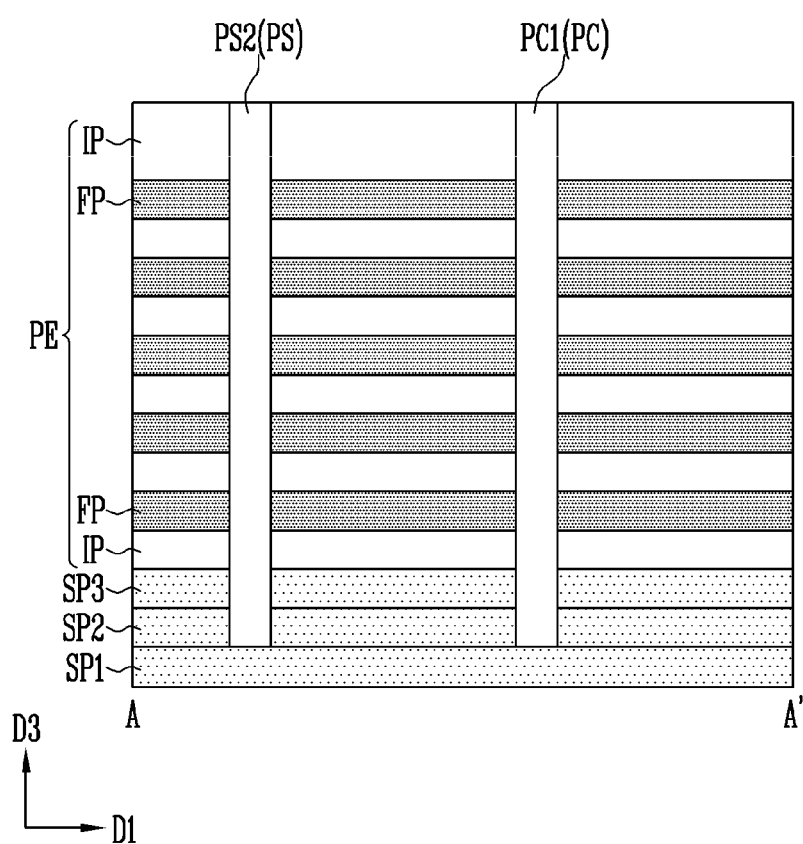
FIGS. 2B, 3B, 4B, 5B, and 6B are cross-sectional views taken along a line A-A' of FIGS. 2A, 3A, 4A, 5A, and 6A, respectively.
Figure 2C:
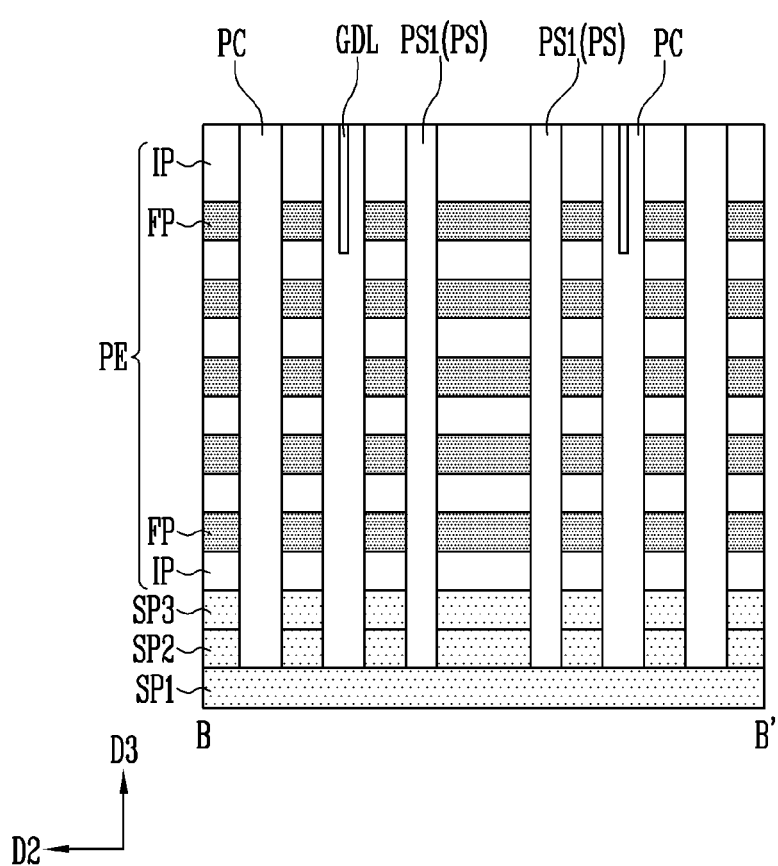
FIGS. 2C, 3C, 4C, 5C, and 6C are cross-sectional views taken along a line B-B' of FIGS. 2A, 3A, 4A, 5A and 6A, respectively.
Figure 3B:
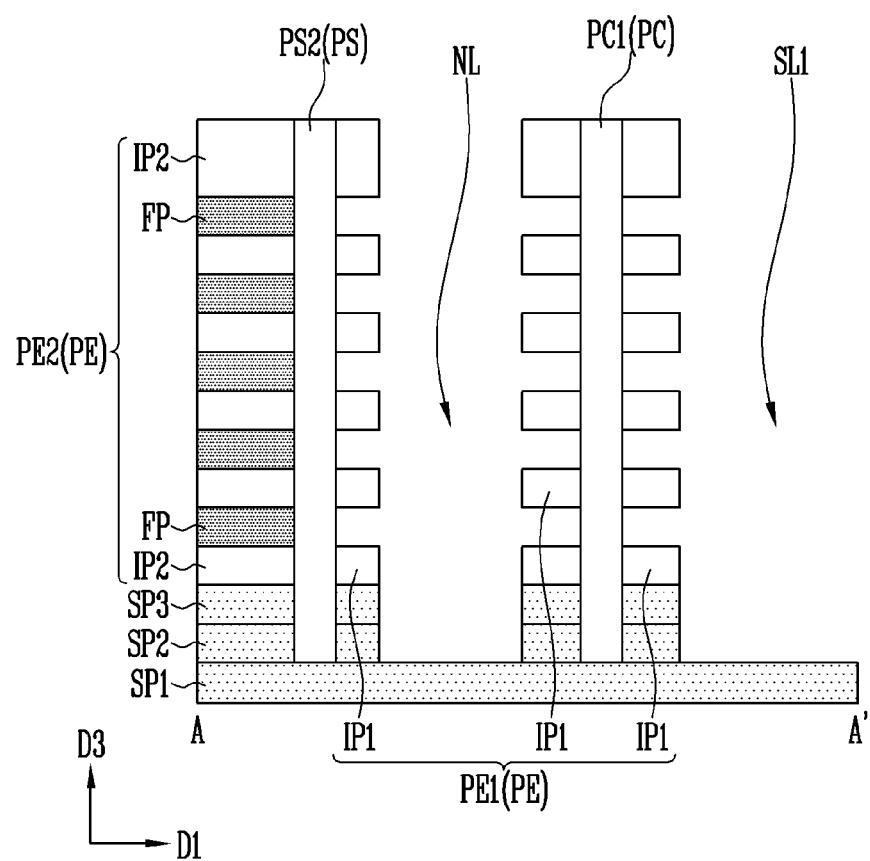
Figure 3C:
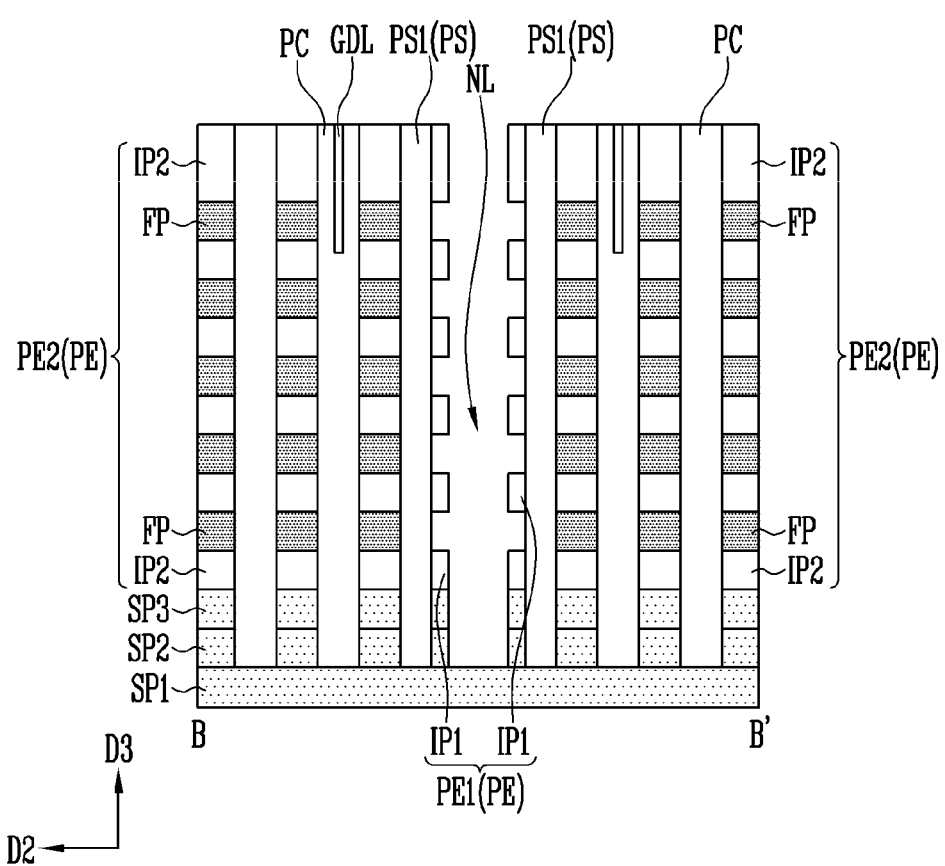
Figure 3D:
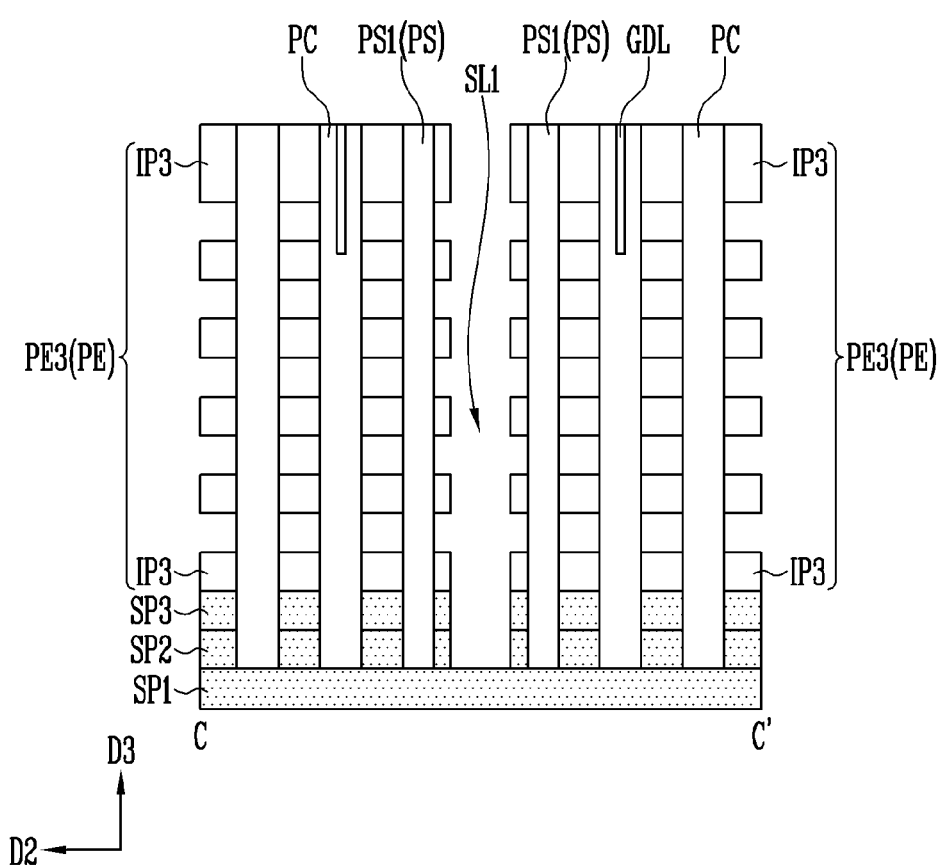
FIGS. 3D, 4D, 5D, and 6D are cross-sectional views taken along a line C-C' of FIGS. 3A, 4A, 5A, and 6A, respectively.
Figure 4B:
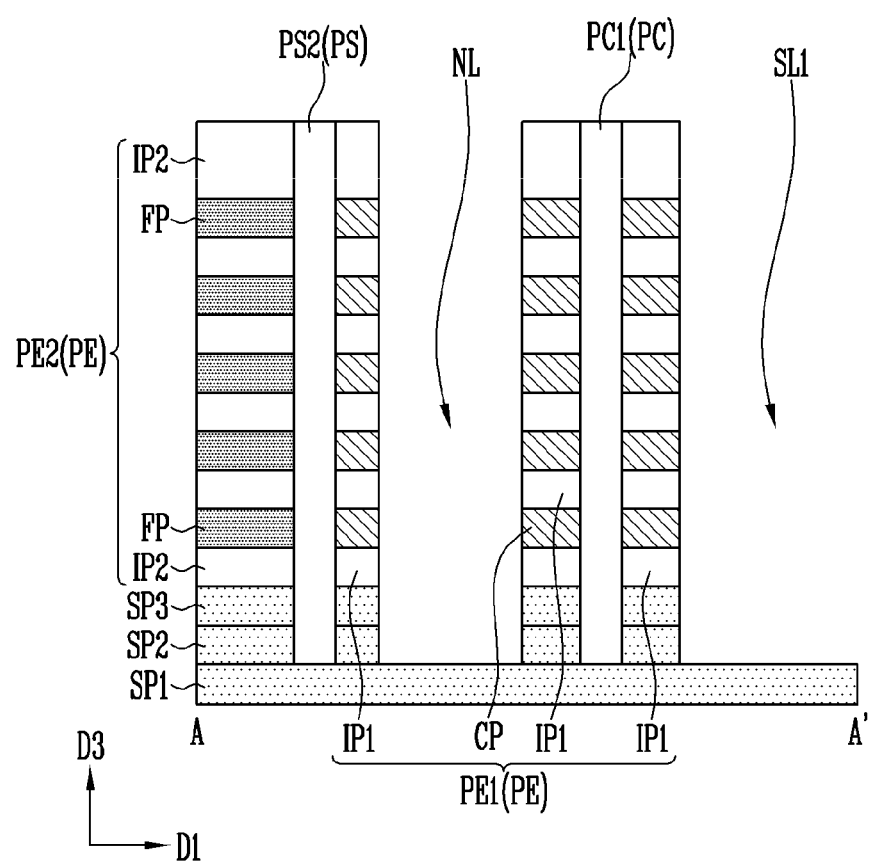
Figure 4C:
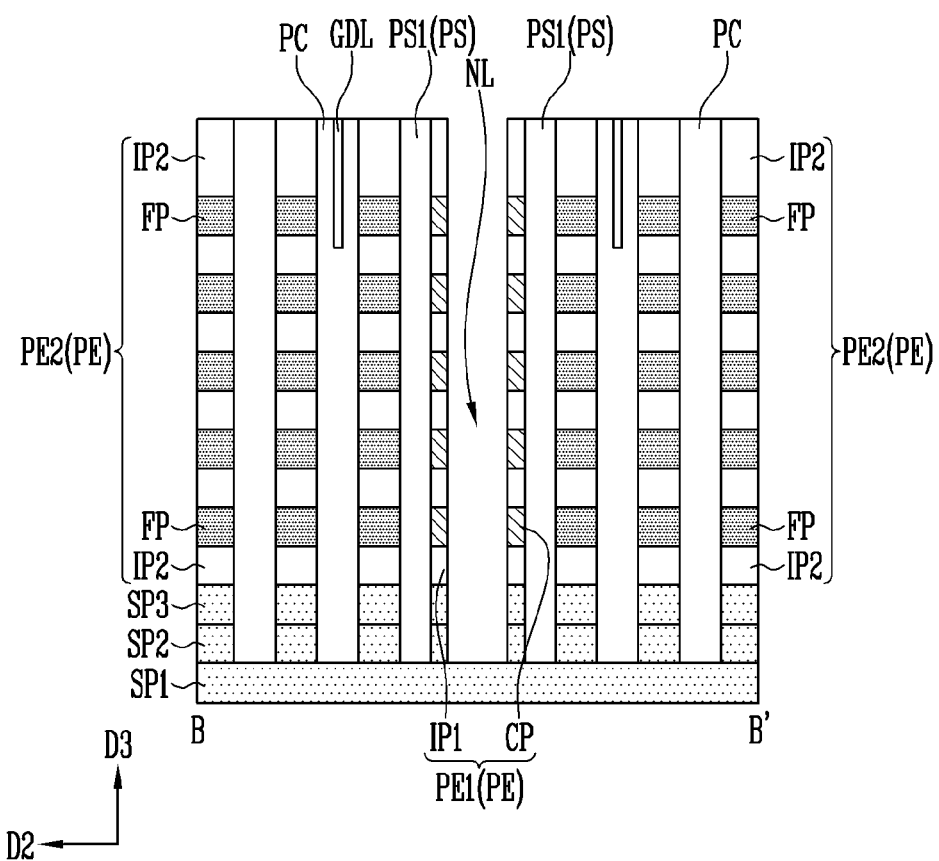
Figure 4D:
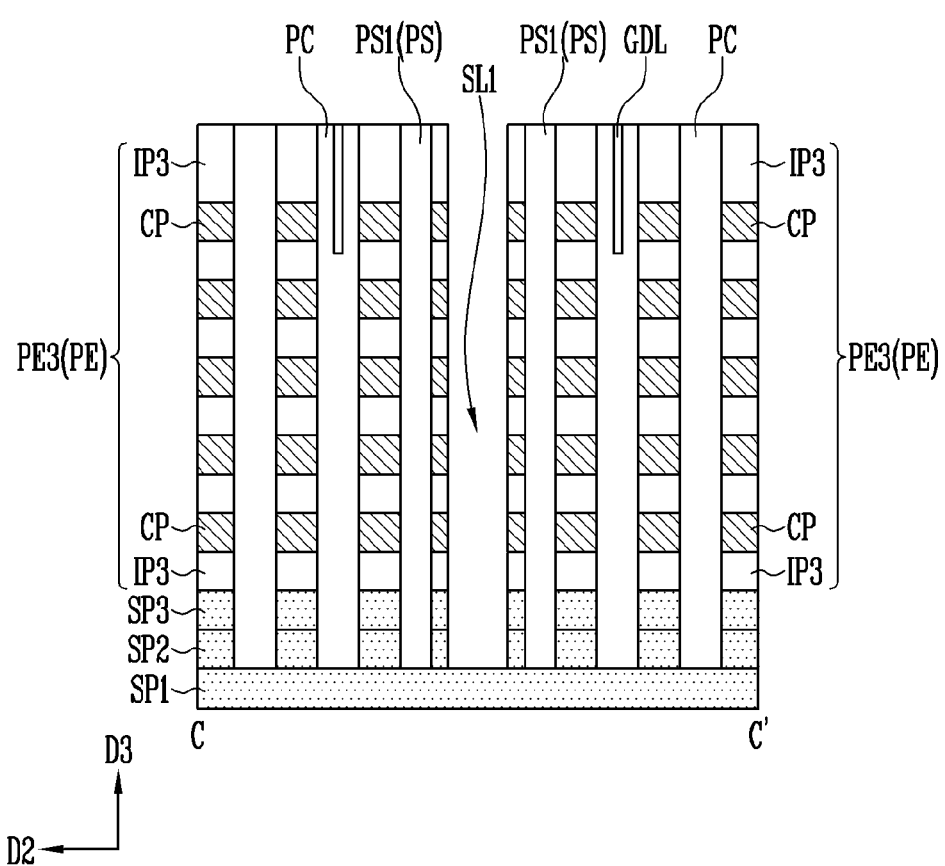
Figure 5A:
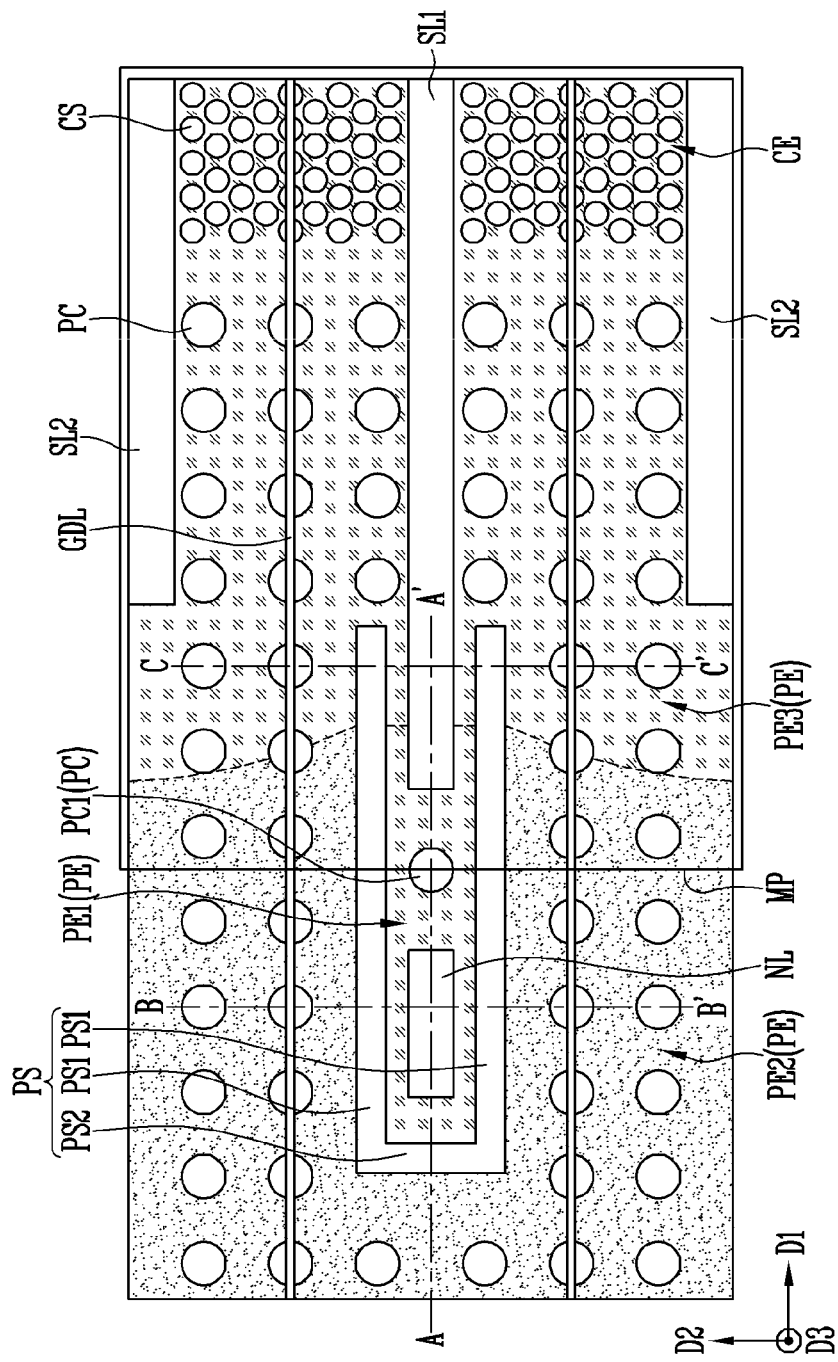
Figure 5B:
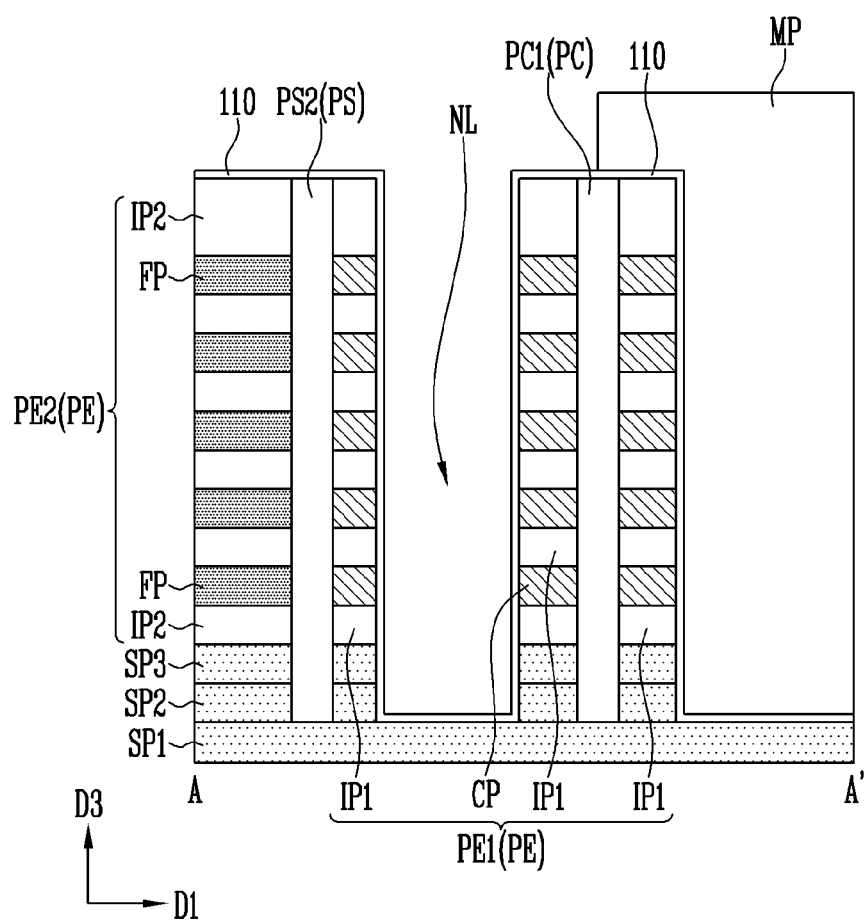
Figure 5C:
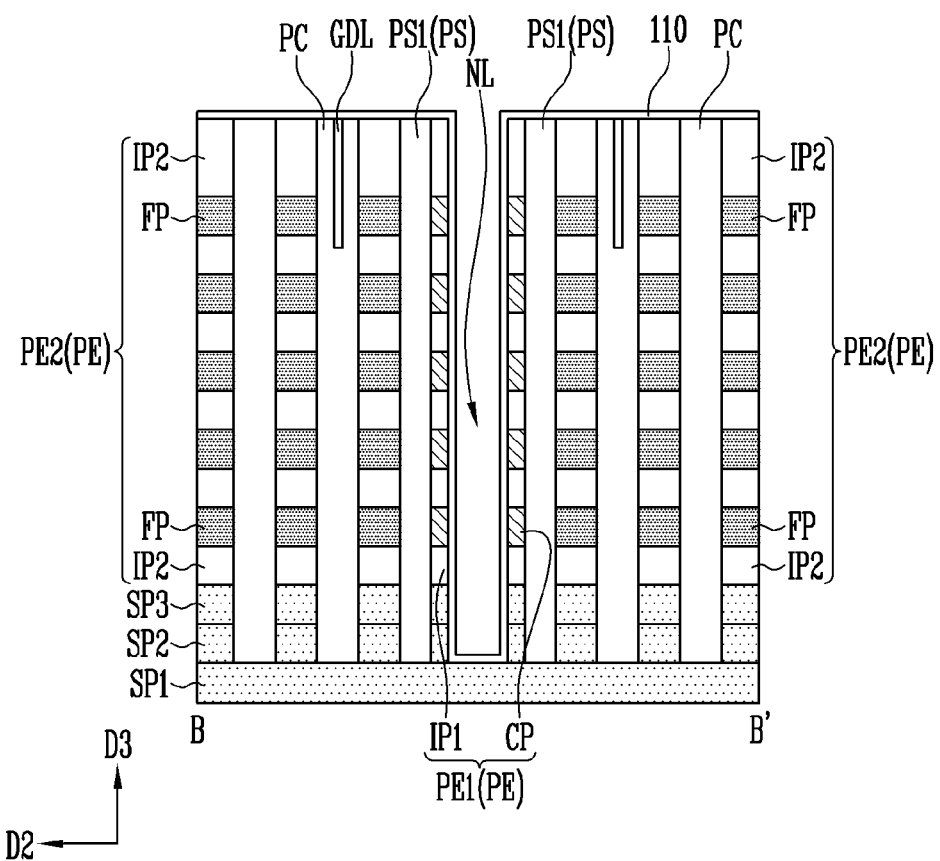
Figure 5D:
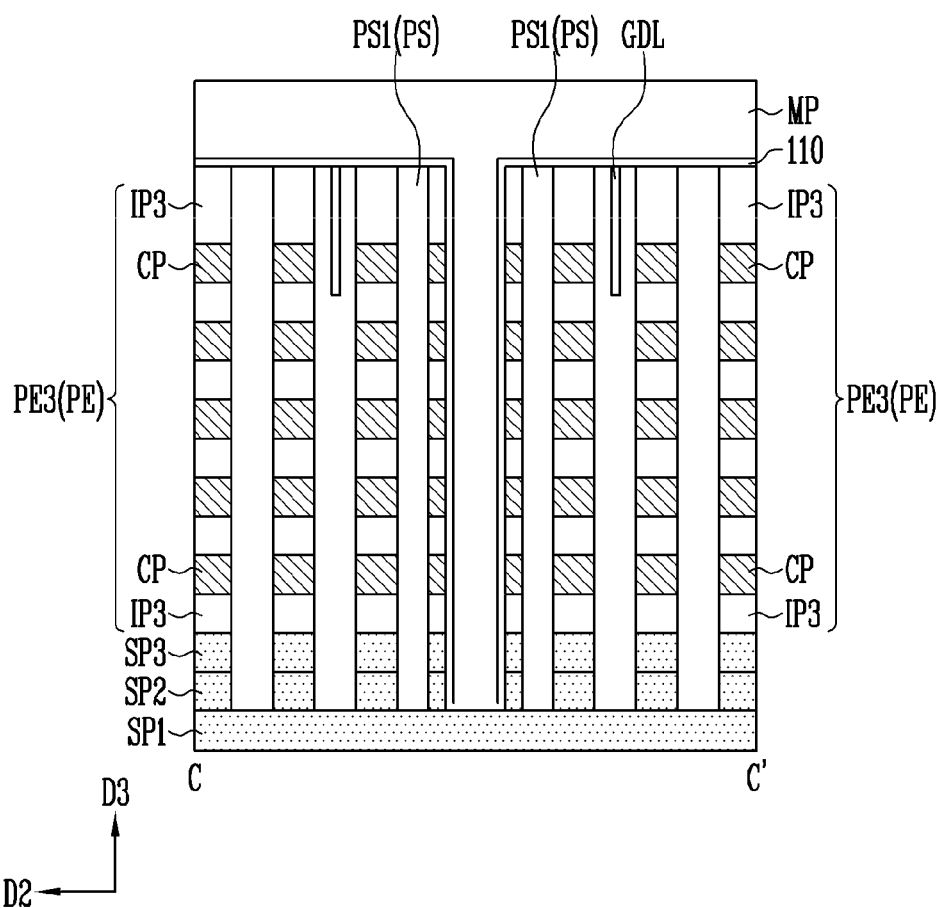
Figure 6A:
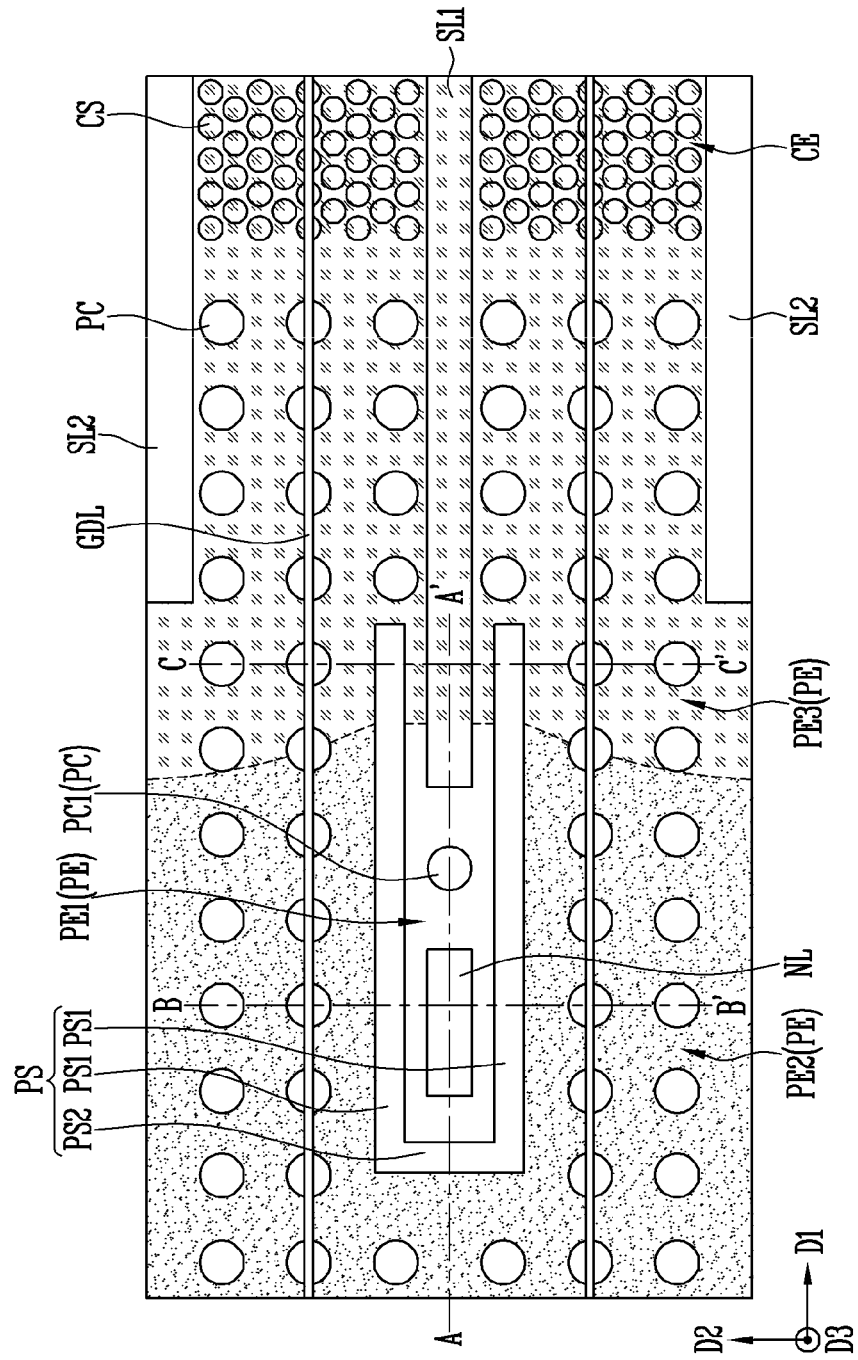
Figure 6B:
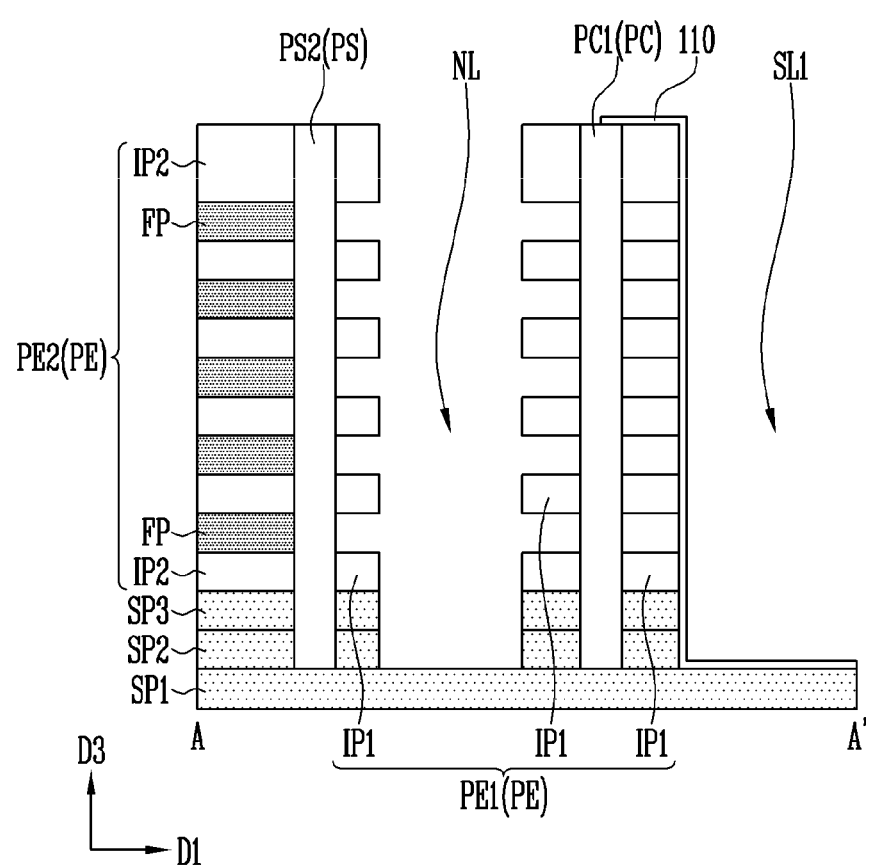
Figure 6C:
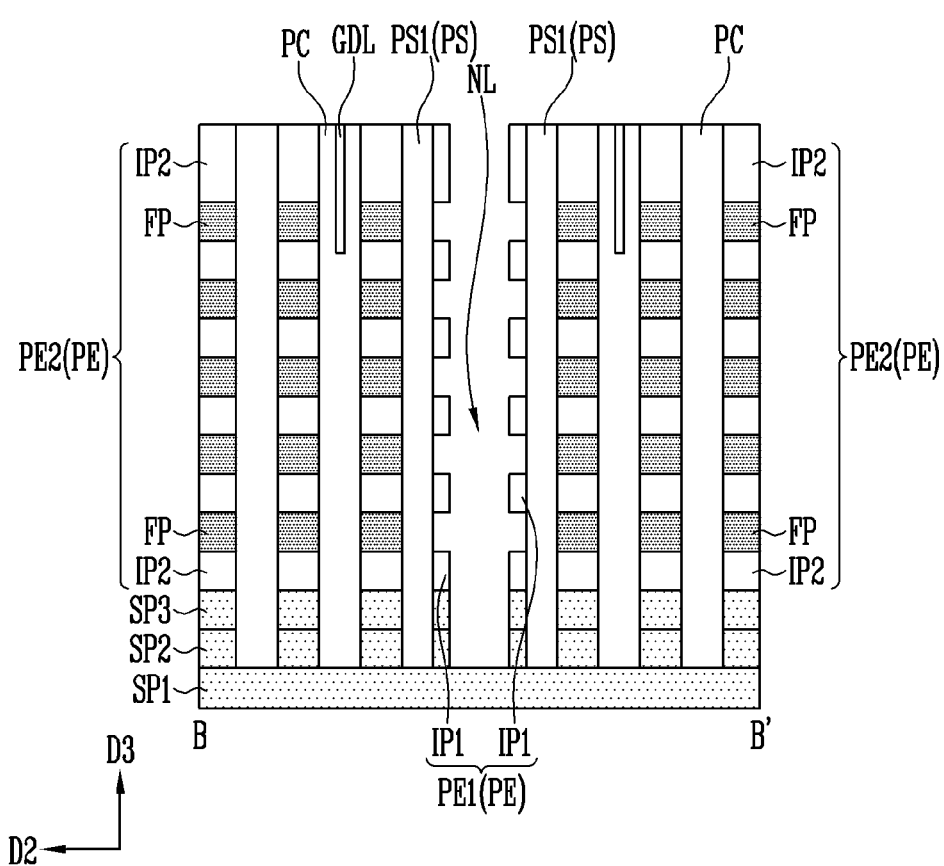
Figure 6D:
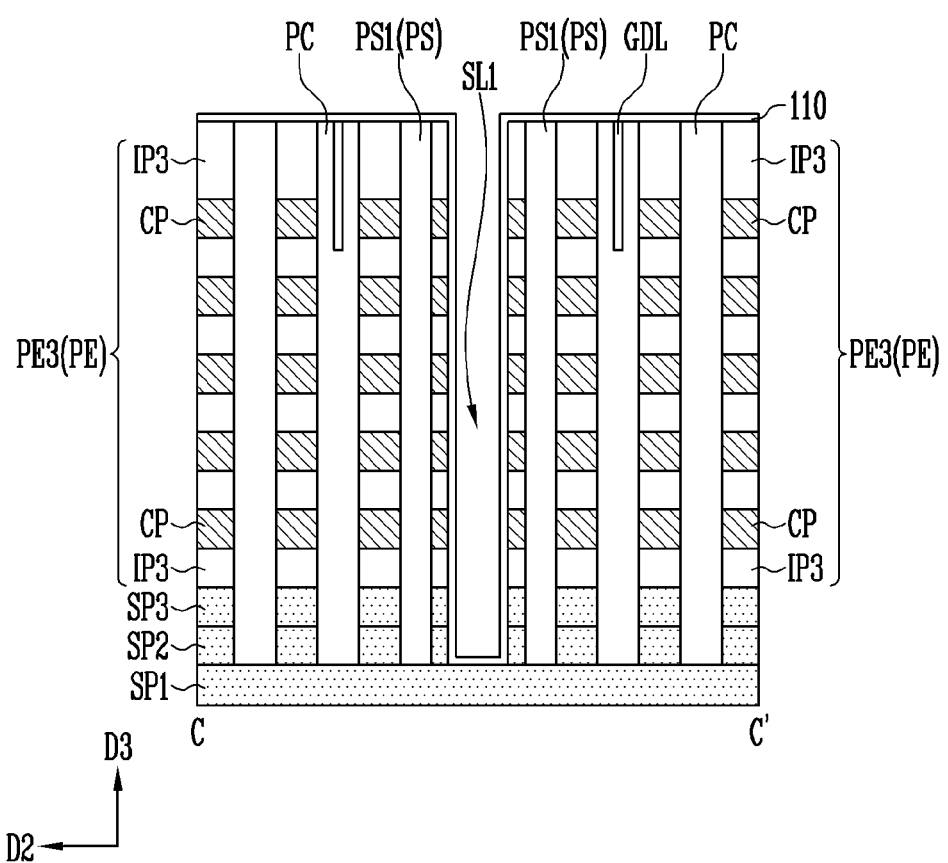

Referring to FIGS. 2A, 2B, and 2C, the second semiconductor layer SP2 may be formed on the first semiconductor layer SP1, and the third semiconductor layer SP3 may be formed on the second semiconductor layer SP2. The peripheral stack PE, the cell stack CE, the channel structures CS, the support pillars PC, and the support structure PS may be formed after the third semiconductor layer SP3 is formed.

After insulating layers and sacrificial layers are alternately stacked on the third semiconductor layer SP3, holes penetrating the insulating layers and the sacrificial layers are formed to form the cell stack CE and the peripheral stack PE including the insulating patterns IP and the sacrificial patterns FP. The holes may be formed to further penetrate the third semiconductor layer SP3 and the second semiconductor layer SP2. Subsequently, the channel structures CS, the support pillars PC, and the support structure PS filled in the holes may be formed.

The gate separation films GDL penetrating the cell stack CE and the peripheral stack PE may be formed. Forming the gate separation films GDL may include patterning an upper portion of each of the cell stack CE, the peripheral stack PE, the channel structures CS, and the support pillars PC to form trenches each extending in the first direction D1, and filling the trenches with oxide.

Referring to FIGS. 3A, 3B, 3C, and 3D, a first slit SL1, second slits SL2, and one or more penetration slits NL may be formed. The first and second slits SL1 and SL2 each may extend in the first direction D1. The first and second slits SL1 and SL2 each may penetrate the cell stack CE and the peripheral stack PE. The penetration slit NL may penetrate the peripheral stack PE. The first and second slits SL1 and SL2 and the penetration slit NL each may further penetrate the second and third semiconductor layers SP2 and SP3.

A portion of the first slit SL1 and the penetration slit NL may be disposed between the first sidewall portions PS1 of the support structure PS. The first slits SL1 may be spaced apart from the first sidewall portions PS1 of the support structure PS in the second direction D2. The penetration slit NL may be spaced apart from the first sidewall portions PS1 of the support structure PS in the second direction D2. The first slit SL1 and the penetration slit NL may be spaced apart from each other in the first direction D1 with the first support pillar PC1 interposed therebetween. The second slits SL2 and the support structure PS may be spaced apart from each other in the first direction D1. The second slits SL2 and the support structure PS may be spaced apart from each other in the second direction D2. The second slits SL2 may be spaced apart from each other in the second direction D2 with the first slit SL1 interposed therebetween. The first and second slits SL1 and SL2 may be spaced apart from each other in the second direction D2. The shortest distance between the second slit SL2 and the support structure PS may be greater than the shortest distance between the first slit SL1 and the support structure PS. As the first and second slits SL1 and SL2 and the penetration slit NL are formed, sidewalls of the insulating patterns IP and the sacrificial patterns FP may be exposed.

The sacrificial patterns FP exposed by the first slit SL1, the second slits SL2, and the penetration slit NL may be selectively etched. Therefore, portions of each of the sacrificial patterns FP may be removed, the portions being adjacent to the first slit SL1, the second slits SL2, and the penetration slit NL.

In the peripheral stack PE, a portion where the sacrificial patterns FP are not removed may be defined as the second portion PE2. The second portion PE2 may include the alternately stacked second insulating patterns IP2 and sacrificial patterns FP.

In the peripheral stack PE, a portion where the sacrificial patterns FP are removed by the first slit SL1 and the penetration slit NL may be defined as the first portion PE1. The first portion PE1 may include the first insulating patterns IP1 spaced apart from each other in the third direction D3. Empty spaces may be formed between the first insulating patterns IP1.

In the peripheral stack PE, a portion where the sacrificial patterns FP are removed by the first and second slits SL1 and SL2 may be defined as the third portion PE3. The third portion PE3 may include the third insulating patterns IP3 spaced apart from each other in the third direction D3. Empty spaces may be formed between the third insulating patterns IP3.

Referring to FIGS. 4A, 4B, 4C, and 4D, the conductive patterns CP may be filled between the first insulating patterns IP1 of the first portion PE1 of the peripheral stack PE and between the third insulating patterns IP3 of the third portion PE3. For example, the conductive patterns CP include first and second conductive patterns, the first conductive patterns CP may fill first spaces, respectively, each of the first spaces being between an adjacent pair of the first insulating patterns IP1 of the first portion PE1, and the second conductive patterns CP may fill second spaces, respectively, each of the second spaces being between an adjacent pair of the third insulating patterns IP3 of the third portion PE3. Sidewalls of the conductive patterns CP may be exposed by the first and second slits SL1 and SL2 and the penetration slit NL.

Referring to FIGS. 5A, 5B, 5C, 5D, a first insulating film 110 may be formed on the peripheral stack PE. The first insulating film 110 may cover an upper surface of the first semiconductor layer SP1 exposed by the first and second slits SL1 and SL2 and the penetration slit NL, sidewalls of the second and third semiconductor layers SP2 and SP3, sidewalls of the first, second, and third insulating patterns IP1, IP2, and IP3, and sidewalls of the conductive patterns CP.

A mask pattern MP may be formed on the first insulating film 110. Forming the mask pattern MP may include forming a mask layer on the first insulating film 110, and patterning the mask layer. The mask pattern MP may completely fill the first and second slits SL1 and SL2. The mask pattern MP may expose the penetration slit NL. A portion adjacent to the first and second slits SL1 and SL2 of the first insulating film 110 may be further covered by the mask pattern MP. A portion adjacent to the penetration slit NL of the first insulating film 110 may be exposed by the mask pattern MP.

Referring to FIGS. 6A, 6B, 6C, and 6D, the first insulating film 110 may be etched using the mask pattern MP as an etch mask. For example, a portion of the first insulating film 110 that is not covered by the mask pattern MP when seen in the plan view of FIG. 5A may be etched. As a result, sidewalls of the first insulating patterns IP1 and the conductive patterns CP of the first portion PE1 of the peripheral stack PE may be exposed again by the penetration slit NL. Subsequently, the mask pattern MP may be removed.

The conductive patterns CP of the first portion PE1 of the exposed peripheral stack PE may be selectively removed. An empty space may be formed again between the first insulating patterns IP1 of the first portion PE1 of the peripheral stack PE.

Referring back to FIGS. 1A to 1D, the second insulating film 120 may be formed on the peripheral stack PE. The second insulating film 120 may be filled between the first insulating patterns IP1 of the first portion PE1 of the peripheral stack PE. The second insulating film 120 may be filled in a portion of the penetration slit NL. The second insulating film 120 may be filled in a portion of the first and second slits SL1 and SL2.

The first slit SL1 may be completely filled with the first slit structure SS1, the penetration slit NL may be completely filled with the penetration structure NS, and the second slits SL2 may be completely filled with the second slit structures SS2. For example, the remaining portion of the first slit SL1 may be substantially completely filled with one or more conductive materials to form the first slit structure SS1, the remaining portion of the penetration slit NL may be substantially completely filled with one or more conductive materials to form the penetration structure NS, and the remaining portion of the second slits SL2 may be substantially completely filled with an insulating material.

Figure 7:
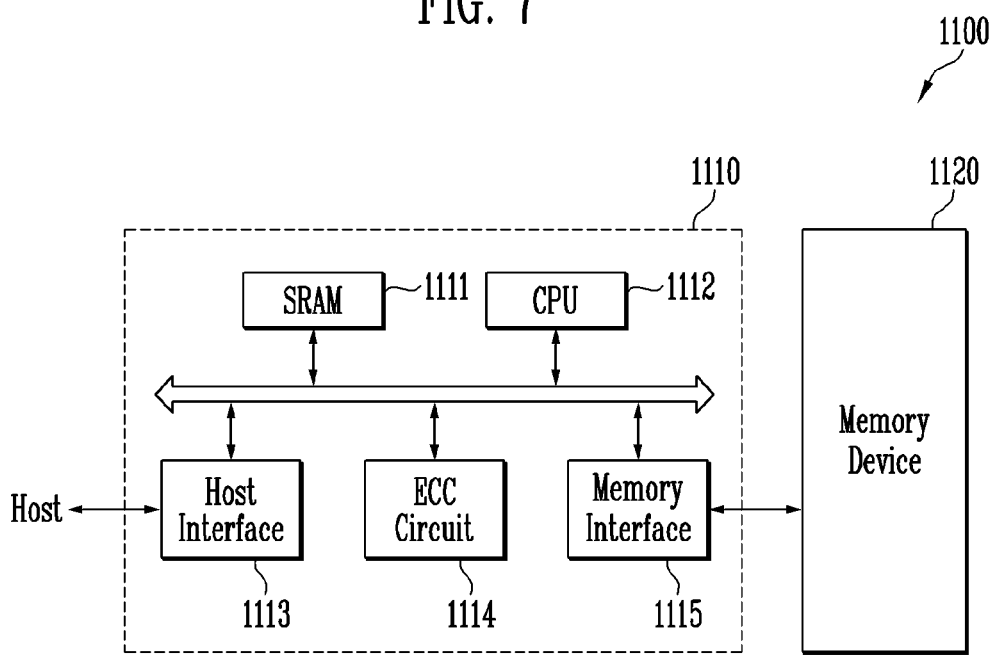
FIG. 7 is a block diagram illustrating a configuration of a memory system according to an embodiment of the present disclosure.

FIG. 7 is a block diagram illustrating a configuration of a memory system according to an embodiment of the present disclosure.

Referring to FIG. 7, the memory system 1100 according to an embodiment of the present disclosure includes a memory device 1120 and a memory controller 1110.

The memory device 1120 may include the structure described with reference to FIGS. 1A to 1D. The memory device 1120 may be a multi-chip package configured of a plurality of flash memory chips.

The memory controller 1110 is configured to control the memory device 1120 and may include a static random access memory (SRAM) 1111, a central processing unit (CPU) 1112, a host interface 1113, an error correction code circuit (ECC) circuit 1114, and a memory interface 1115. The SRAM 1111 is used as an operation memory of the CPU 1112, the CPU 1112 performs all control operations for data exchange of the memory controller 1110, and the host interface 1113 includes a data exchange protocol of a host connected to the memory system 1100. In addition, the ECC circuit 1114 detects and corrects an error included in data read from the memory device 1120 and the memory interface 1115 performs interfacing with the memory device 1120. In addition, the memory controller 1110 may further include a read only memory (ROM) that stores code data for interfacing with the host.

The memory system 1100 described above may be a memory card or a solid state disk (SSD) with which the memory device 1120 and the memory controller 1110 are combined. For example, when the memory system 1100 is an SSD, the memory controller 1110 may communicate with the outside (for example, a host) through at least one of various interface protocols such as a universal serial bus (USB), a multimedia card (MMC), a peripheral component interconnection-express (PCI-E), a serial advanced technology attachment (SATA), a parallel advanced technology attachment (PATA), a small computer small interface (SCSI), an enhanced small disk interface (ESDI), and integrated drive electronics (IDE).

Figure 8:
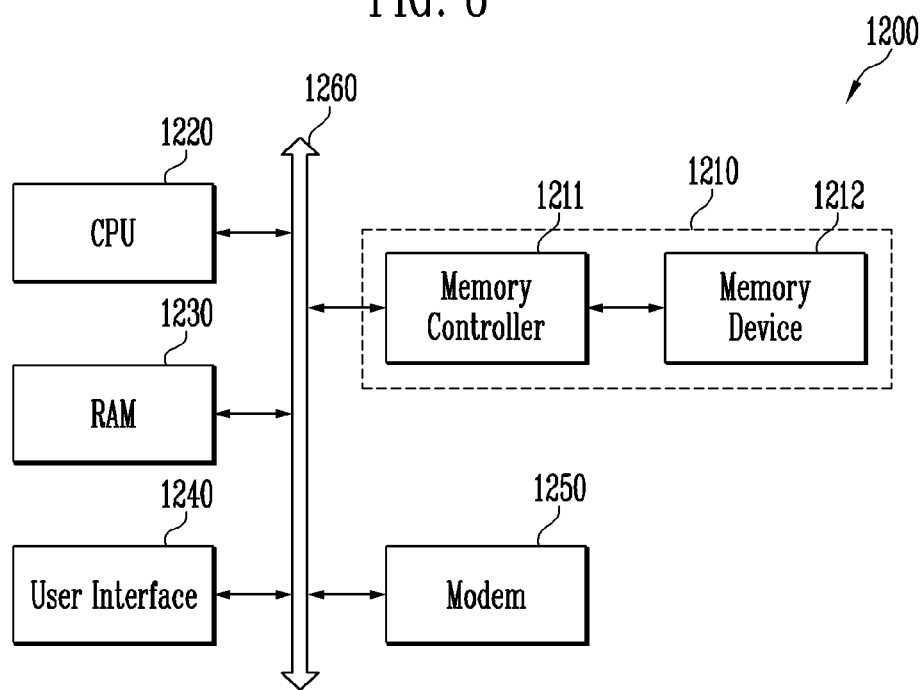
FIG. 8 is a block diagram illustrating a configuration of a computing system according to an embodiment of the present disclosure.

FIG. 8 is a block diagram illustrating a configuration of a computing system according to an embodiment of the present disclosure.

Referring to FIG. 8, the computing system 1200 according to an embodiment of the present disclosure may include a CPU 1220, a random access memory (RAM) 1230, a user interface 1240, a modem 1250, and a memory system 1210, which are electrically connected to a system bus 1260. In addition, when the computing system 1200 is a mobile device, a battery for supplying an operation voltage to the computing system 1200 may be further included, and an application chipset, a camera image processor (CIS), a mobile DRAM, and the like may be further included.

The memory system 1210 may be configured of the memory device 1212 and the memory controller 1211 as described with reference to FIG. 7.

What is claimed is:

1. A method of manufacturing a semiconductor memory device, the method comprising:
   forming a cell stack and a peripheral stack;
   forming a support structure penetrating the peripheral stack, the peripheral stack including a first portion disposed in the support structure;
   forming a penetration slit penetrating the first portion, the first portion including first sacrificial patterns and first insulating patterns;
   removing the first sacrificial patterns of the first portion through the penetration slit;
   filling first spaces with first conductive patterns, each of the first spaces between an adjacent pair of the first insulating patterns of the first portion; and
   removing the first conductive patterns of the first portion through the penetration slit.

2. The method of claim 1, wherein the peripheral stack further includes a second portion connected to the cell stack, the method further comprising:
   forming a first slit penetrating the second portion, the second portion including second sacrificial patterns and second insulating patterns;
   removing the second sacrificial patterns of the second portion through the first slit; and
   filling second spaces with second conductive patterns, each of the second spaces between an adjacent pair of the second insulating patterns of the second portion.

3. The method of claim 2, wherein a portion of the first slit is disposed in the support structure.

4. The method of claim 1, wherein the support structure includes first sidewall portions spaced apart from each other and a second sidewall portion connecting the first sidewall portions to each other, and
   wherein the penetration slit is disposed between the first sidewall portions.

5. The method of claim 1, further comprising, after removing the first conductive patterns of the first portion, filling the first spaces with an insulating film.

6. The method of claim 1, wherein removing the first conductive patterns of the first portion through the penetration slit comprises:
   forming an insulating film that covers the first conductive patterns of the first portion; and
   forming a mask pattern exposing the insulating film.

7. The method of claim 6, wherein removing the first conductive patterns of the first portion through the penetration slit further comprises etching the insulating film using the mask pattern as an etch mask to expose the first conductive patterns of the first portion.

8. A method of manufacturing a semiconductor memory device, the method comprising:
   forming a cell stack and a peripheral stack including insulating patterns and sacrificial patterns;
   forming a support structure penetrating the peripheral stack;
   forming a first slit penetrating the cell stack and the peripheral stack, a portion of the first slit being disposed in the support structure;
   forming a penetration slit penetrating the peripheral stack, the penetration slit being disposed in the support structure;
   removing the sacrificial patterns of the peripheral stack through the first slit and the penetration slit;
   filling spaces with conductive patterns, each of the spaces between an adjacent pair of the insulating patterns of the peripheral stack; and
   removing the conductive patterns exposed by the penetration slit.

9. The method of claim 8, wherein removing the conductive patterns exposed by the penetration slit comprises forming a mask pattern that fills the first slit and exposes the penetration slit.

10. The method of claim 8, further comprising, after removing the conductive patterns, filling the spaces with an insulating film.

* * * * *